(12) United States Patent
Min

(10) Patent No.: US 8,692,371 B2
(45) Date of Patent: Apr. 8, 2014

(54) SEMICONDUCTOR APPARATUS AND MANUFACTURING METHOD THEREOF

(75) Inventor: Byoung-Gue Min, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/549,795

(22) Filed: Jul. 16, 2012

(65) Prior Publication Data

US 2013/0026631 A1 Jan. 31, 2013

(30) Foreign Application Priority Data

Jul. 29, 2011 (KR) .................. 10-2011-0075657

(51) Int. Cl.
*H01L 23/48* (2006.01)
(52) U.S. Cl.
USPC .............. 257/750; 257/E23.01; 257/E23.011; 257/E21.499; 438/459
(58) Field of Classification Search
USPC ............ 257/750, E23.01, E23.011, 21.499 E; 438/459
See application file for complete search history.

(56) References Cited

U.S. PATENT DOCUMENTS

| 6,475,889 | B1 | 11/2002 | Ring | |
|---|---|---|---|---|
| 7,232,770 | B2 | 6/2007 | Moore et al. | |
| 7,605,054 | B2 * | 10/2009 | Celler | 438/456 |
| 7,834,461 | B2 * | 11/2010 | Asai et al. | 257/774 |
| 8,415,805 | B2 * | 4/2013 | Shen | 257/774 |
| 2008/0067562 | A1 * | 3/2008 | Kawasaki | 257/289 |
| 2012/0153476 | A1 * | 6/2012 | Shen | 257/750 |

FOREIGN PATENT DOCUMENTS

KR 10-2006-0002405 A 1/2006
KR 10-0797130 B1 1/2008

* cited by examiner

*Primary Examiner* — David Vu
*Assistant Examiner* — Brandon Fox
(74) *Attorney, Agent, or Firm* — Rabin & Berdo, P.C.

(57) ABSTRACT

Disclosed are a semiconductor apparatus and a manufacturing method thereof. The manufacturing method of the semiconductor apparatus includes: forming a semiconductor chip on a semiconductor substrate; adhering a carrier wafer with a plurality of through holes onto the semiconductor chip; polishing the semiconductor substrate; forming a first via hole at the rear side of the polished semiconductor substrate; forming a first metal layer below the polished semiconductor substrate and at the first via hole; and removing the carrier wafer from the polished semiconductor substrate.

12 Claims, 7 Drawing Sheets

SEMICONDUCTOR APPARATUS AND MANUFACTURING METHOD THEREOF

CROSS-REFERENCE TO RELATED APPLICATIONS

This application is based on and claims priority from Korean Patent Application No. 10-2011-0075657, filed on Jul. 29, 2011, with the Korean Intellectual Property Office, the disclosure of which is incorporated herein in its entirety by reference.

TECHNICAL FIELD

The present disclosure relates to a semiconductor apparatus and a manufacturing method thereof, and more particularly, to a semiconductor apparatus minimizing a thickness of a semiconductor substrate including a semiconductor device and an integrated circuit and facilitating heat emission of a power amplifier or a power semiconductor using a semiconductor device, by forming a via hole for connecting a ground pad and the rear side of the semiconductor substrate electrically and thermally, and a manufacturing method thereof.

BACKGROUND

In general, a semiconductor chip and an external circuit are mainly electrically connected with each other by wire bonding. However, in the case where the semiconductor chip is used for operating at a high frequency, resistance and inductance components due to a wire operate as undesired elements in a circuit operation. When several ground pads exist in the circuit in the semiconductor chip and are grounded through wire bonding, oscillation due to a minute difference between ground voltages in the ground pads occurs in some cases. Since a ground pad for wire bonding is additionally disposed at the edge of the semiconductor chip in order to minimize a length of the wire, an area of the chip increases and the chip cost rises.

Meanwhile, in the case of the semiconductor chip such as the power amplifier or the power semiconductor, the semiconductor chip is required not to operate at a high temperature by rapidly discharging heat generated from the semiconductor device outside the semiconductor chip. The heat generated from the semiconductor device is generally discharged through the semiconductor substrate, but in the case of a semiconductor substrate having high thermal resistance, the heat is not sufficiently discharged to increase a temperature of the semiconductor chip, and as a result, the operation thereof is unstable. In order to solve the problem, a metal having a better heat transfer characteristic than the semiconductor substrate is thickly formed at a part of the front side of the semiconductor device to act as a thermal shunt in some cases, but a heat discharging path needs to be made at the front side of the semiconductor chip so as to discharge heat accumulated in the thermal shunt at the front side outside.

To this end, in order to electrically and thermally connect the semiconductor chip and the outside, the best method is to connect a circuit formed at the front side of the semiconductor chip to the rear side through the via hole with a metal. In particular, in the case of a power amplifier operating at a high frequency, it is most preferable to form a ground through the rear side so as to have the shortest path in order to stabilize an electric characteristic. It is most efficient when heat generated in the semiconductor chip is discharged by a module packaging the semiconductor chip through the via hole of the rear side of the semiconductor substrate.

In the case of a semiconductor device and an integrated circuit manufactured on a semiconductor substrate (hereinafter, referred to as a "compound semiconductor substrate") made of a compound, the via hole needs to be formed at the compound semiconductor substrate. The compound semiconductor substrate includes GaAs, InP and SiC substrates and the like, and a deep etching technique for forming the via hole is not completed as compared with a general Si substrate. In particular, in the case of the SiC substrate, the maximum etching speed is 2 μm per minute in a current technique. Accordingly, if the thickness of the semiconductor substrate may be formed thin, it is possible to largely overcome difficulty in a process for etching the via hole. As the thickness of the semiconductor substrate becomes thinner, heat transfer resistance through the semiconductor substrate becomes smaller, and thus the heat discharge is easy, to thereby largely contribute to stability of the semiconductor chip.

As described above, according to the related art, the via hole is formed at the rear side by etching the semiconductor substrate having a thickness of about 100 μm, but in a compound semiconductor substrate made of a specific material, etching itself is difficult, or although the etching is possible, etching over a long period of time causes the thermal damage to the semiconductor chip or breakdown in equipment.

SUMMARY

The present disclosure has been made in an effort to provide a semiconductor apparatus capable of facilitating an etching process of a via hole and improving heat emission by minimizing a thickness of a semiconductor substrate, and a manufacturing method thereof.

An exemplary embodiment of the present disclosure provides a semiconductor apparatus, including: a semiconductor substrate with a first via hole formed at the rear side thereof; a semiconductor chip formed on the semiconductor substrate; and a first metal layer formed below the semiconductor substrate and at the first via hole.

Another exemplary embodiment of the present disclosure provides a manufacturing method of a semiconductor apparatus, including: forming a semiconductor chip on a semiconductor substrate; adhering a carrier wafer with a plurality of through holes onto the semiconductor chip; polishing the semiconductor substrate; forming a first via hole at the rear side of the polished semiconductor substrate; forming a first metal layer below the polished semiconductor substrate and at the first via hole; and removing the carrier wafer from the polished semiconductor substrate.

According to the exemplary embodiments of the present disclosure, it is possible to improve a heat discharge characteristic through a semiconductor substrate and reduce limitations of a process condition and a time required for etching a via hole at the rear side of the semiconductor substrate, by providing a semiconductor apparatus capable of minimizing a thickness of the semiconductor substrate with a semiconductor chip and a manufacturing method thereof.

It is possible to accelerate heat discharge through a ground pad at the front side of the semiconductor substrate or a via hole at the rear side of the semiconductor substrate, by providing a semiconductor apparatus including a thermal shunt structure on the front side of the semiconductor substrate and a manufacturing method thereof.

It is possible to reduce the size of a semiconductor chip, by providing a semiconductor apparatus in which an electrode pad for a bias and input and output of a signal is positioned on the same plane as the semiconductor chip, and a manufacturing method thereof.

Therefore, it is possible to improve a characteristic of a semiconductor device or a power amplifier or a power semiconductor which is manufactured by using the same, stabilize a process, and reduce a chip cost.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. In describing the present disclosure, well-known functions or constructions will not be described in detail since they may unnecessarily obscure the understanding of the present disclosure.

Figure 1:
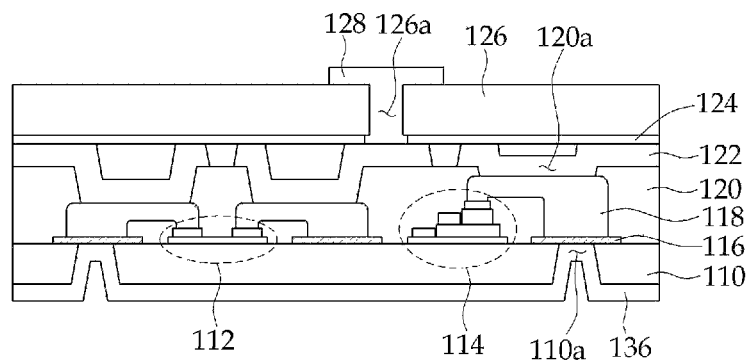
FIG. 1 is a cross-sectional view illustrating the configuration of a semiconductor apparatus according to an exemplary embodiment of the present disclosure.

FIG. 1 is a cross-sectional view illustrating the configuration of a semiconductor apparatus according to an exemplary embodiment of the present disclosure.

Referring to FIG. 1, the semiconductor apparatus according to an exemplary embodiment of the present disclosure includes a semiconductor substrate 110, semiconductor devices 112 and 114, a ground pad 116, an air-bridge metal 118, an insulating layer 120, a second metal layer 122, an adhesive 124, a support substrate 126, an electrode pad 128, a first metal layer 136 and the like.

The semiconductor substrate 110 may be a semiconductor wafer such as Si, GaAs, InP, SiC or GaN, or a sapphire substrate made of $Al_2O_3$. Hereafter, an SiC substrate will be described as an example.

The semiconductor substrate 110 may be formed with a thickness of 10 μm to 100 μm, and a first via hole 110a is formed on the rear side thereof. In the case of a general SiC substrate, lapping and polishing processes may be performed up to the thickness of 100 μm, but in the exemplary embodiment of the present disclosure, the semiconductor substrate 110 may be formed with a thickness of 10 μm to 100 μm by the support substrate 126.

The semiconductor devices 112 and 114 are formed at one side above the semiconductor substrate 110, and as illustrated in FIG. 1, may be a high electron mobility transistor (HEMT) device 112, a heterojunction bipolar transistor (HBT) device 114 or the like. In the HEMT device 112, a buffer layer and a channel layer are epitaxially grown on the semiconductor substrate 110, and a source electrode, a gate electrode and a drain electrode are formed thereon, and other regions except for an active layer with the electrode are etched. In the HBT device 114, an emitter electrode, a base electrode and a collector electrode are formed on the semiconductor substrate 110 where a sub collector layer, a collector layer, a base layer and an emitter layer are grown.

The ground pad 116 is formed at the other side above the semiconductor substrate 110, and although not illustrated, a circuit including an active device, a passive device, an interconnection metal and the like may be formed on the same surface as the ground pad 116. Herein, the ground pad 116 may be connected with an electrode of each semiconductor device, or connected with the first via hole 110a on the rear side of the semiconductor substrate 110.

The ground pad 116 is configured by a plurality of metal layers. For example, the ground pad 116 is configured by laminating nickel (Ni) and gold (Au) in sequence. Herein, the ground pad 116 is configured with two layers in order to use a difference in an etching speed between the two layers, when forming the first via hole 110a on the rear side of the semiconductor substrate 110.

The air-bridge metal 118 connects the electrodes of the semiconductor devices 112 and 114 and the ground pad 116. That is, as illustrated in FIG. 1, the source electrode and the drain electrode of the HEMT device 112 are connected with the ground pad 116 disposed at the left and right of the HEMT device 112 through the air-bridge metal 118, respectively, and the emitter electrode of the HBT device 114 is connected with the ground pad 116 disposed at the right of the HBT device 114 through the air-bridge metal 118. Although not illustrated in FIG. 1, the gate electrode of the HEMT device 112, and the base electrode and the collector electrode of the HBT device 114 may be connected with electrodes of another semiconductor device or the ground pads 116, respectively. In the exemplary embodiment of the present disclosure, the electrodes of the semiconductor devices 112 and 114 and the ground pad 116 are connected to each other through the air-bridge metal 118, but is not limited thereto and may be connected to each other through an interconnection metal formed by general metal deposition and lift off methods.

The insulating layer 120 is formed on the front side of the semiconductor substrate 110 including the air-bridge metal 118, and includes a second via hole 120a where the air-bridge metal 118 is exposed. Herein, the insulating layer 120 may be configured by an oxide layer such as silicon oxide and aluminum oxide, a nitride layer such as silicon nitride, or a benzocyclobutene (BCB) polymer.

The second metal layer 122 is formed above the air-bridge metal 118 exposed through the second via hole 120a of the insulating layer 120. Accordingly, the second metal layer 122 acts as a thermal shunt which is a moving path of heat to the rear side through the ground pad 116. In this case, the second metal layer 122 is divided into three parts above the insulating layer 120, and the middle part of the second metal layer 122 connects the drain electrode of the HEMT device 112 and the electrode pad 128 disposed at the front side.

The support substrate 126 is adhered onto the second metal layer 122 by using the adhesive 124 such as BCB polymer, and includes a third via hole 126a where the second metal layer 122 is exposed. Herein, the support substrate 126 may be made of a material having sufficient mechanical strength and formed with an enough thickness to handle a chip. To this end, the support substrate 126 may be an Si substrate and may be formed with a thickness of 100 μm.

The electrode pad 128 is formed at the third via hole 126a of the support substrate 126.

In general, the electrode pad is connected with other electrodes except for the source electrode and the emitter electrode which are mainly used for grounding in the semiconductor device such as the HEMT device and the HBT device. Accordingly, in a semiconductor chip manufactured by the existing method, since a bias pad and an input and output pad are generally positioned at the edge of the semiconductor chip in consideration of wire bonding, the size of the semiconductor chip is increased. However, in the exemplary embodiment of the present disclosure, since the semiconductor devices 112 and 114 or other circuits exist on the same plane, and the electrode pad 128 is disposed at the support substrate 126, the area of the semiconductor chip is not increased.

The first metal layer 136 is formed below the semiconductor substrate 110 and at the first via hole 110a of the semiconductor substrate 110 and is connected with the ground pad 116 through the first via hole 110a of the semiconductor substrate 110. Herein, the first metal layer 136 is configured by a seed metal layer including titanium (Ti) and gold (Au), and gold (Au) plated on the seed metal layer. In this case, the plated gold (Au) has a thickness of 5 μm to 10 μm.

Figure 2A:
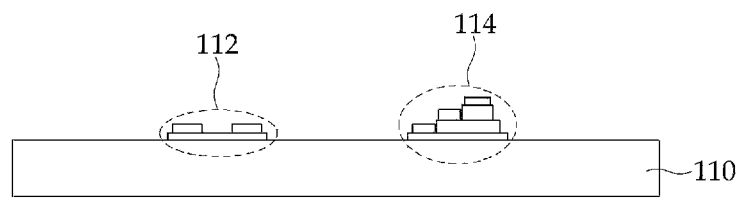
FIGS. 2A to 2P are process cross-sectional views illustrating a manufacturing method of the semiconductor apparatus according to the exemplary embodiment of the present disclosure.
Figure 2B:
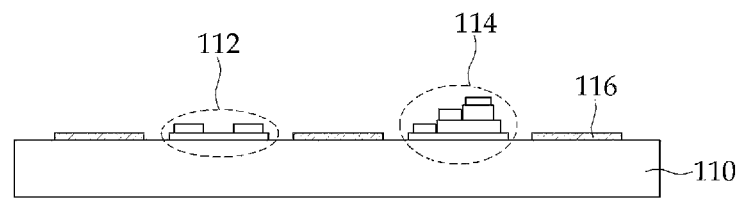
Figure 2C:
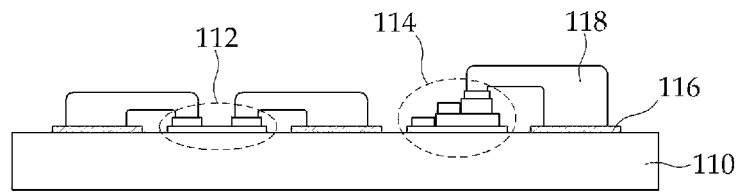
Figure 2D:
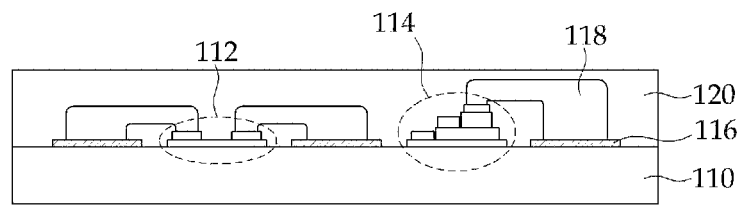
Figure 2E:
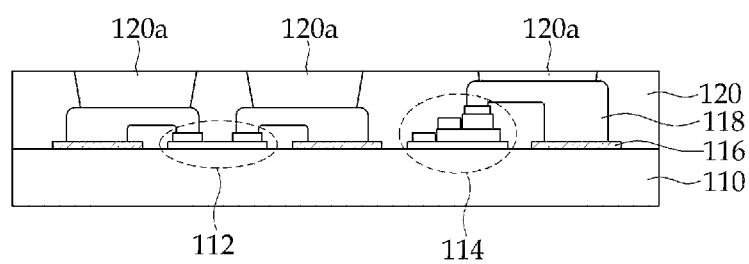
Figure 2F:
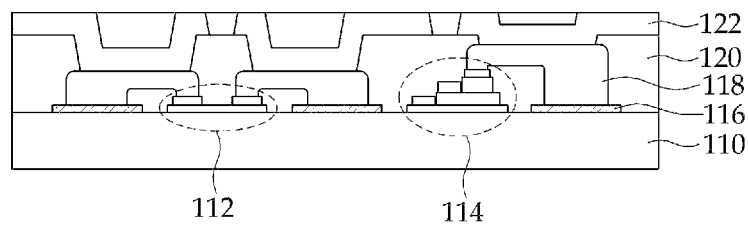
Figure 2G:
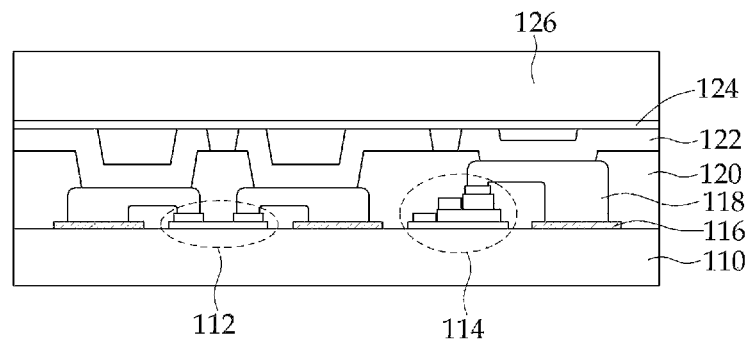
Figure 2H:
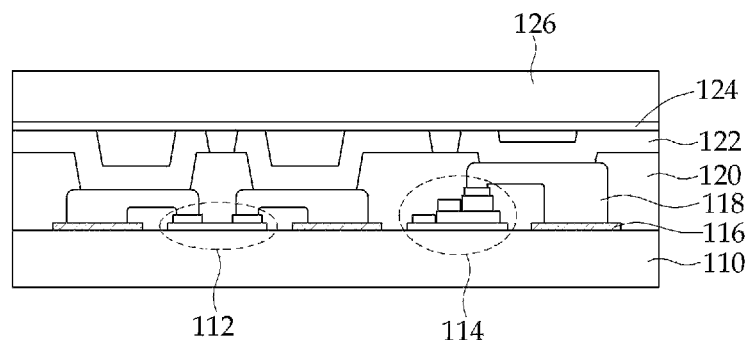
Figure 2I:
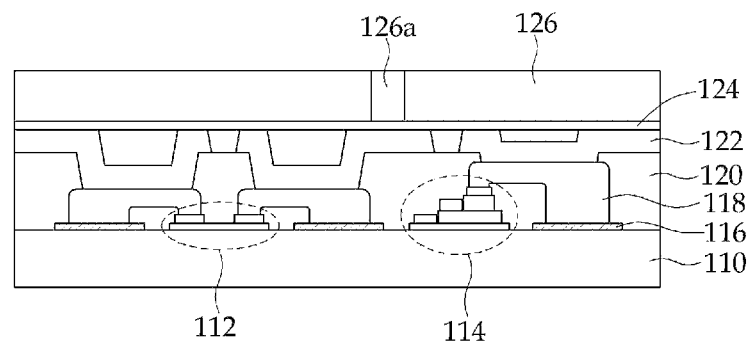
Figure 2J:
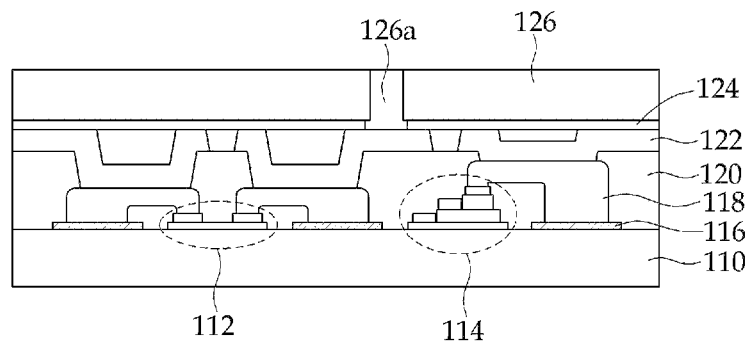
Figure 2K:
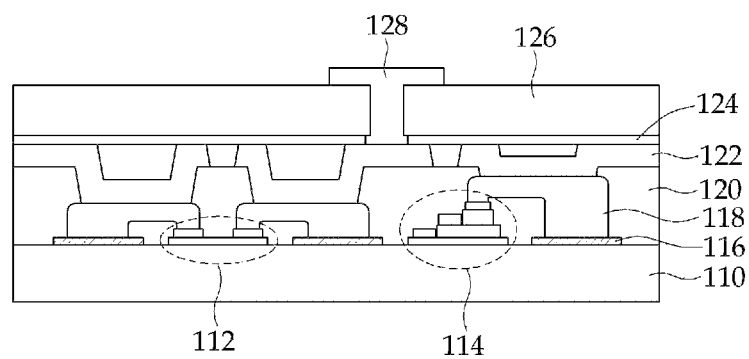
Figure 2L:
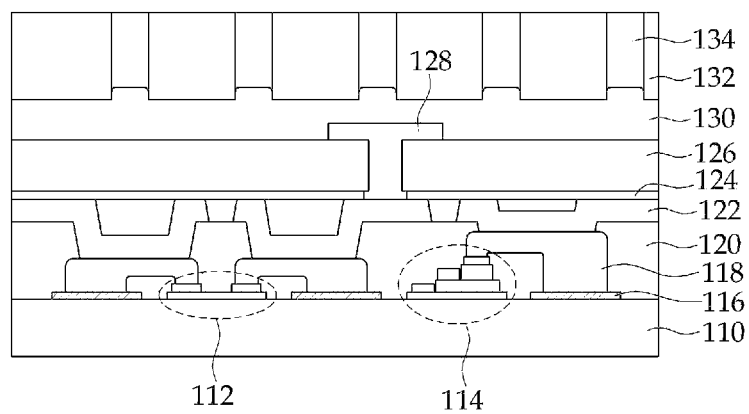
Figure 2M:
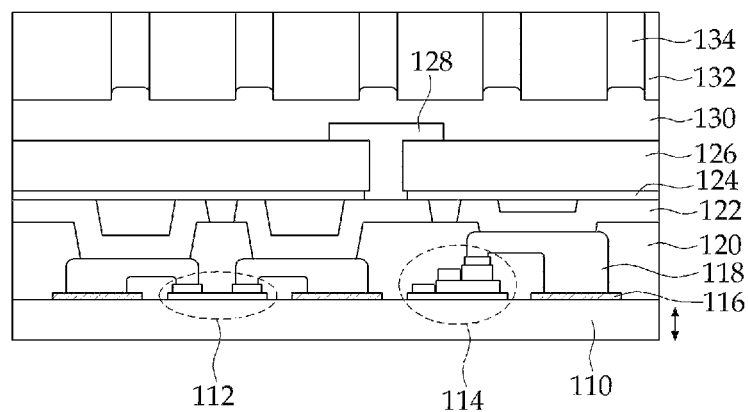
Figure 2N:
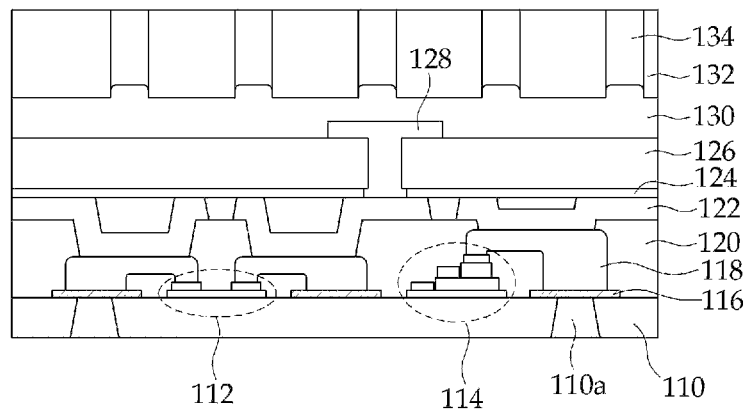
Figure 2O:
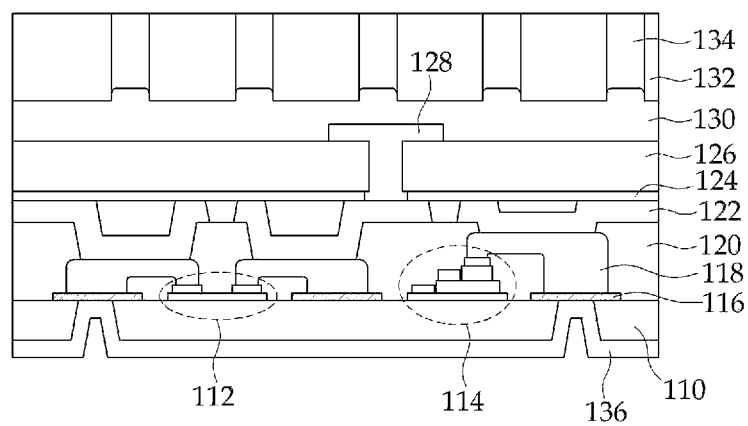
Figure 2P:
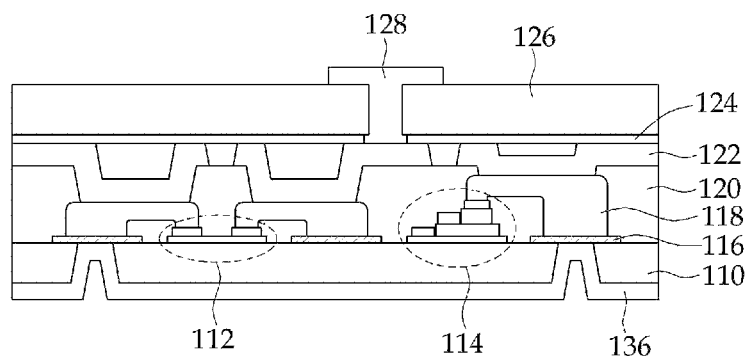

FIGS. 2A to 2P are process cross-sectional views illustrating a manufacturing method of the semiconductor apparatus according to the exemplary embodiment of the present disclosure.

Before the description, the semiconductor substrate 110 may be a semiconductor wafer such as Si, GaAs, InP, SiC or GaN, or a sapphire substrate made of $Al_2O_3$. Hereafter, an SiC substrate will be described as an example.

Referring to FIG. 2A, the semiconductor devices 112 and 114 including a high electron mobility transistor (HEMT) device 112, a heterojunction bipolar transistor (HBT) device 114 and the like are formed at one side above the semiconductor substrate 110. The HEMT device 112 is manufactured by epitaxially growing a buffer layer and a channel layer on the semiconductor substrate 110, forming a source electrode, a gate electrode and a drain electrode thereon, and etching other regions except for an active layer with the electrode. The HBT device 114 is manufactured by forming an emitter electrode, a base electrode and a collector electrode on the semiconductor substrate 110 where a sub collector layer, a collector layer, a base layer and an emitter layer are grown.

In the exemplary embodiment of the present disclosure, the HEMT device 112 and the HBT device 114 are exemplified as the semiconductor devices 112 and 114, but are not limited thereto, and various semiconductor devices such as a metal-oxide-semiconductor field-effect transistor (MOSFET), a metal-semiconductor field-effect transistor (MESFET), a bipolar junction transistor (BJT) and the like may be formed on the semiconductor substrate 110. The HEMT device 112 and the HBT device 114 are not formed on the semiconductor substrate 110 at the same time, and only one of the two may be formed on the semiconductor substrate 110.

Referring to FIG. 2B, the ground pad 116 is formed at the other side above the semiconductor substrate 110. In detail, the ground pad 116 is formed by laminating nickel (Ni) and gold (Au) above the semiconductor substrate 110 in sequence. Herein, the ground pad 116 is configured with two layers in order to use a difference in an etching speed between the two layers, when forming the first via hole 110a on the rear side of the semiconductor substrate 110. The ground pad 116 may be connected with an electrode of each semiconductor device, or connected with the first via hole 110a on the rear side of the semiconductor substrate 110 to be described below.

Although not illustrated, a circuit including an active device, a passive device, an interconnection metal and the like may be formed on the same surface as the ground pad 116.

Referring to FIG. 2C, an air-bridge metal 118, which connects the semiconductor devices 112 and 114 and the ground pad 116, is formed. That is, the source electrode and the drain electrode of the HEMT device 112 are connected with the ground pad 116 disposed at the left and right of the HEMT device 112 through the air-bridge metal 118, respectively, and the emitter electrode of the HBT device 114 is connected with the ground pad 116 disposed at the right of the HBT device 114 through the air-bridge metal 118. Although not illustrated in FIG. 2C, the gate electrode of the HEMT device 112, and the base electrode and the collector electrode of the HBT device 114 may be connected with electrodes of another semiconductor device or the ground pads 116, respectively. Herein, the electrodes of the semiconductor devices 112 and 114 and the ground pad 116 are connected to each other through the air-bridge metal 118, but are not limited thereto, and may be connected to each other through an interconnection metal formed by general metal deposition and lift off methods.

Referring to FIG. 2D, after forming the air-bridge metal 118, the insulating layer 120 is formed on the front side of the semiconductor substrate 110 including the air-bridge metal 118. Herein, the insulating layer 120 may be a multi layer configured by an oxide layer such as silicon oxide and aluminum oxide, a nitride layer such as silicon nitride, BCB polymer or those layers so as to have a heat resistance characteristic enough to be endurable even in an increase in a temperature of the semiconductor substrate 110 when etching the first via hole 110a of the semiconductor substrate 110 to be described below.

Thereafter, planarization is performed with respect to the insulating layer 120, and the insulating layer 120 is formed with a sufficient thickness so as to be entirely coated up to the top of the semiconductor devices 112 and 114.

Referring to FIG. 2E, the second via hole 120a where a part of the air-bridge metal 118 is exposed is formed at the insulating layer 120. Herein, in the case where the insulating layer 120 is a single layer made of the BCB polymer, a pattern is formed by using a photosensitive characteristic of the BCB polymer or through etching by using a patterned photoresist as a mask. In this case, as illustrated in FIG. 2E, the BCB polymer may be sufficiently etched so that a part of the air-bridge metal 118 may be exposed.

Referring to FIG. 2F, the second metal layer 122 is formed and patterned above the exposed air-bridge metal 118 and the insulating layer 120. Herein, the second metal layer 122 may be formed through electron beam evaporation, a lift off method, or plating. The second metal layer 122 may be formed through the plating so that a metal having a sufficient thickness may be deposited at the side of the second via hole 120a. The reason is because a step of the second via hole 120a formed at the insulating layer 120 may be solved and the second metal layer 122 may act as a thermal shunt, as the thickness of the second metal layer 122 is thicker.

The second metal layer 122 is formed at a predetermined position of the front side in order to connect an electrode pad 128 to be described below. That is, as illustrated in FIG. 2F, the second metal layer 122 is divided into three parts, and the drain electrode of the HEMT device 112 and the electrode pad 128 to be described below are connected with each other through the middle part of the second metal layer 122.

Referring to FIG. 2G, the support substrate 126 is adhered onto the semiconductor substrate 110 with a semiconductor chip by using the adhesive 124. Herein, the support substrate 126 physically supports the semiconductor chip after all the processes are completed, has minimum mechanical strength so as to be endurable even in a chip dicing process for separating the semiconductor chip, and needs to be made of a material suitable for forming a third via hole 126a to be described below. The adhesive 124 needs to have sufficient thermal stability and be made of an etchable material. To this end, the Si substrate may be used as the support substrate 126, and the BCB polymer may be used as the adhesive 124.

Referring to FIG. 2H, the support substrate 126 is polished with a proper thickness. Herein, the support substrate 126 may be formed with enough thickness to handle a chip. To this end, the support substrate 126 is formed with a thickness of 100 µm.

Referring to FIG. 2I, the third via hole 126a is formed at the support substrate 126. In detail, a photomask is arranged after coating the photoresist on the support substrate 126, and a pattern is formed at a desired position through a lithography process. In this case, since the support substrate 126 is the Si substrate, the support substrate 126 is opaque against visible light, and thus the arrangement of the photomask may be difficult, but the photomask may be relatively easily arranged by using a rear arrangement method using infrared light. Thereafter, the third via hole 126a is formed by etching the support substrate 126 of a photoresist region opened through a dry etching method such as an inductively coupled plasma (ICP) etching and the like. As illustrated in FIG. 2I, the third via hole 126a is formed on the second metal layer 122 connected with the drain electrode of the HEMT device 112. Although not illustrated in FIG. 2I, a connection line connected with another electrode exists, and the third via hole 126a may also be formed thereon.

Referring to FIG. 2J, the second metal layer 122 is exposed through the third via hole 126 by etching the adhesive 124 in the third via hole 126a of the support substrate 126. In this case, the etching is performed under the same etching condition as the support substrate 126, but another etching method may also be used according to a material of the adhesive 124.

Referring to FIG. 2K, the electrode pad 128 is formed at the third via hole 126a of the support substrate 126. In this case, the electrode pad 128 is formed through plating in an open region of the patterned photoresist. Herein, the electrode pad 128 is connected with other electrodes except for the source electrode and the emitter electrode which are mainly used as a ground in the semiconductor devices 112 and 114.

In a semiconductor chip manufactured by the existing method, since a bias pad and an input and output pad are generally positioned at the edge of the semiconductor chip in consideration of wire bonding, the size of the semiconductor chip is increased.

However, in the exemplary embodiment of the present disclosure, since the semiconductor devices 112 and 114 or other circuits exist on the same plane, and the electrode pad 128 is disposed at the support substrate 126, the area of the semiconductor chip needs not to be increased. Accordingly, it is possible to significantly reduce a manufacturing cost of the semiconductor chip.

Referring to FIG. 2L, a carrier wafer 132 is adhered onto the semiconductor substrate 110 with the semiconductor chip by using an adhesive 130. Herein, the adhesive 130 may be thermoplastic polymer such as wax, BCB polymer or the like.

In the case of using the thermoplastic polymer as the adhesive 130, the adhesive 130 may be easily attached and detached by making the thermoplastic polymer be in a melting state by increasing the temperature, but is limitatively used at a high temperature. In the case of using the BCB polymer, the adhesive 130 may be relatively endurable to the high temperature, but is hardly removed when the temperature rises to a curing temperature or more.

In the case where the material of the semiconductor substrate 110 with the semiconductor chip is SiC, the temperature of the semiconductor substrate 110 rises due to an inductively coupled plasma etching environment having high power and a long etching time depending on a low etching speed when etching the via hole, and as a result, the adhesive 130 may be damaged. That is, when wax having a low melting point is used, the problem may be generated. Accordingly, the BCB polymer having a higher usage temperature than the wax may be used.

A plurality of through holes 134 are formed at the carrier wafer 132, and a part of each through hole 134 is filled with the adhesive. Accordingly, a stripper may be rapidly in contact with the adhesive 130, that is, the BCB polymer through the plurality of through holes 134 formed at the carrier wafer 132, and the carrier wafer 132 may be easily removed from the support substrate 126. When the BCB polymer is removed while being immersed in the stripper, if the plurality of through holes 134 are not formed, a great deal of time is required, and even the BCB polymer used as the adhesive 124 between the second metal layer 122 and the support substrate 126 may be influenced.

Referring to FIG. 2M, a thickness (represented by arrow) of the semiconductor substrate is minimized by polishing the semiconductor substrate 110 with the semiconductor chip.

In the case where the semiconductor substrate 110 is an SiC substrate, lapping and polishing processes may be generally performed up to the thickness of 100 µm. The reason is because, in the case where the thickness of the semiconductor substrate 110 is thinner than 100 µm, although a first metal layer 136 to be described below is thickly placed, there is a problem of handling after the rear process is completed.

However, in the exemplary embodiment of the present disclosure, the semiconductor substrate 110 may be polished up to a maximum thickness of 10 µm by the support substrate 126. The reason is because, in the lapping and polishing processes, a thickness deviation in the wafer occurs, and actually, nonuniformity of about 10 µm occurs.

Referring to FIG. 2N, the first via hole 110a is formed by etching the rear side of the polished semiconductor substrate 110 through a dry etching method such as ion beam milling, reactive ion etching (RIE), inductively coupled plasma etching and the like. In this case, reaction gas such as $BCl_3$, $Cl_2$, $CH_4$, $CHF_3$, $CCl_4$, $SF_6$ and the like may be used according to the kind of semiconductor substrate 110. As an etching mask, a polymer-based material such as the patterned photoresist may be used, but in the case where the semiconductor substrate 110 is the SiC substrate, a metal layer by deposition or plating is used. To this end, it is known that the etching selectivity of a nickel (Ni) mask is highest as compared with the SiC substrate. However, a thickness of nickel of several µm or more is required under a normal etching condition.

In the existing invention (Korean Patent Application No. 2002-7013603), since the thickness of the SiC substrate is 100 µm to 200 µm, the etching speed is 0.5 µm/min to 0.8 µm/min, and the selectivity of the etching mask is about 150, etching needs to be performed from a minimum of 130 minutes to a maximum of 400 minutes. Indium tin oxide (ITO) used as the etching mask needs to have a thickness of 1.4 µm or more in consideration of the selectivity.

In the present disclosure, since an SiC etching speed is about 0.5 µm/min in inductively coupled plasma etching using $SF_6$ and $O_2$, and the selectivity of nickel used as a mask is 50, in order to etch SiC having the thickness of 30 µm, 60 minutes may be taken and the thickness of nickel may be 0.6

μm or more. That is, since the etching time may be sufficiently reduced, it is advantageous to prevent deterioration in a characteristic of the device and decomposition in the adhesive according to the temperature rising of the semiconductor substrate, without straining etching equipment.

In the exemplary embodiment of the present disclosure, over-etching is sufficiently performed against the case where the bottom of the first via hole 110a does not have the same depth due to nonuniformity of the etching speed or nonuniformity of thickness of the semiconductor substrate 110 depending on a position of the wafer, when etching the semiconductor substrate 110. In this case, nickel of the ground pad 116 acts as an etch stopper, and thus in the case of the via hole having a relatively fast etching speed at a part in the wafer, it is possible to prevent etching from being performing by passing through the ground pad 116.

Referring to FIG. 20, a surface contamination layer of the ground pad 116 which is exposed at the rear side of the semiconductor substrate 110 with the semiconductor chip is removed through a method such as ion beam milling and the like. The reason is because the surface contamination layer may be formed on the ground pad 116 exposed at the rear side of the semiconductor substrate 110 by reaction gas such as F, Cl, O and the like, and the formed surface contamination layer may be a factor to increase contact resistance with the first metal layer 136 formed by a subsequent plating process.

Thereafter, a seed metal layer is formed by sputtering and depositing titanium (Ti) and gold (Au) on the rear side of the polished semiconductor substrate 110 in sequence, and the first metal layer 136, which is connected with the ground pad 116 through the first via hole 110a, is formed by plating the seed metal layer with gold to a thickness of 5 μm to 10 μm.

Referring to FIG. 2P, the carrier wafer 132 and the adhesive 130, which are formed above the support substrate 126, are removed. Herein, the adhesive 130 is removed by a proper method according to the physical property as illustrated in FIG. 2L. In this case, since the thickness of the support substrate 126 is 100 μm, although the thickness of the semiconductor substrate 110 is thin, there is no problem of handling for chip dicing, chip selecting and packaging.

Figure 3:
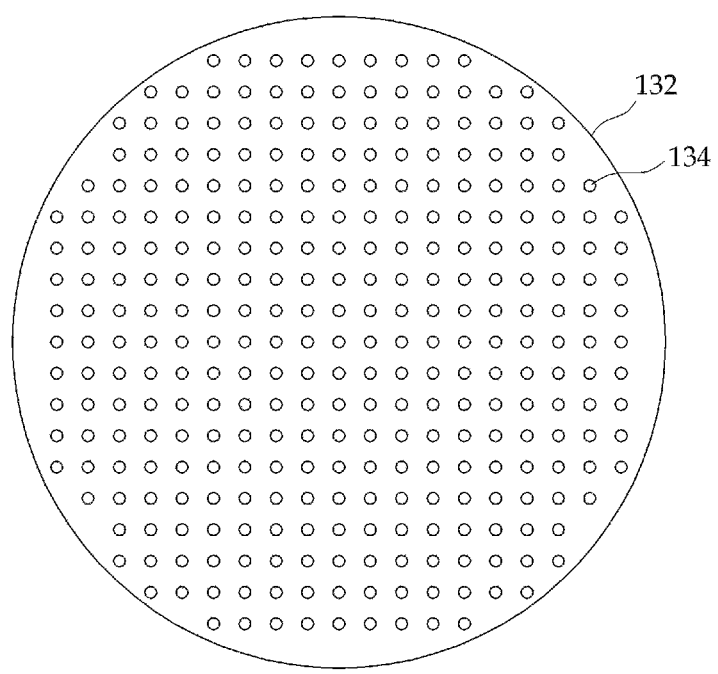
FIG. 3 is a plan view illustrating a carrier wafer according to the exemplary embodiment of the present disclosure.

FIG. 3 is a plan view illustrating a carrier wafer according to the exemplary embodiment of the present disclosure.

Referring to FIG. 3, the carrier wafer 132 needs to have strength enough to have durability against a mechanical impact in the rear side process of the semiconductor substrate 110, and have heat conductivity enough to rapidly discharge heat generated when the first via hole 110a of the semiconductor substrate 110 is etched. The carrier wafer 132 is required not to react with an acidic or basic solution. As a result, the carrier wafer 132 may be a sapphire substrate having a sufficient characteristic to satisfy the above condition, but an SiC substrate having heat conductivity similar to the metal may be more suitable for the carrier wafer 132 (that is, it is reported that the heat conductivity of SiC Is about 4.9 W/cmK).

A plurality of through holes 134 are formed at the carrier wafer 132 according to the exemplary embodiment of the present disclosure. The plurality of through holes 134 have diameters of about 100 μm to 1 mm, and are processed by a laser.

In the present disclosure, the heat generated in the semiconductor devices 112 and 114 may be more rapidly discharged through the semiconductor substrate 110 due to the thinner thickness of the semiconductor substrate 110, thereby improving and stabilizing performance of the semiconductor chip. In the present disclosure, the heat generated in the semiconductor devices 112 and 114 may be transferred to the rear side of the semiconductor substrate 110 through the first via hole 110a due to the thermal shunt structure formed at the front side of the semiconductor substrate 110.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor apparatus, comprising:
a semiconductor substrate with a first via hole formed at the rear side thereof;
a semiconductor chip formed on the semiconductor substrate; and
a first metal layer formed below the semiconductor substrate and at the first via hole;
wherein the semiconductor chip includes
a semiconductor device formed at one side above the semiconductor substrate;
a ground pad formed at the other side above the semiconductor substrate;
an air-bridge metal configured to connect an electrode of the semiconductor device and the ground pad;
an insulating layer formed above the semiconductor substrate including the air-bridge metal, and including a second via hole where the air-bridge metal is exposed; and
a second metal layer formed above the exposed air-bridge metal and the insulating layer.

2. The semiconductor apparatus of claim 1, wherein the semiconductor chip further includes:
a support substrate adhered onto the second metal layer and including a third via hole where the second metal layer is exposed; and
an electrode pad formed in the third via hole.

3. The semiconductor apparatus of claim 1, wherein the ground pad is configured by laminating nickel (Ni) and gold (Au) in sequence.

4. The semiconductor apparatus of claim 1, wherein the first via hole is formed through any one dry etching method of ion beam milling, reactive ion etching (RIE) and inductively coupled plasma (ICP) etching using any one reaction gas of $BCl_3$, $Cl_2$, $CH_4$, $CHF_3$, $CCl_4$ and $SF_6$.

5. The semiconductor apparatus of claim 1, wherein the first metal layer is configured by a seed metal layer including titanium (Ti) and gold (Au), and gold (Au) plated on the seed metal layer.

6. The semiconductor apparatus of claim 5, wherein the thickness of the plated gold is 5 μm to 10 μm.

7. A manufacturing method of a semiconductor apparatus, comprising:
forming a semiconductor chip on a semiconductor substrate;
adhering a carrier wafer with a plurality of through holes onto the semiconductor chip;
polishing the semiconductor substrate;
forming a first via hole at the rear side of the polished semiconductor substrate;
forming a first metal layer below the polished semiconductor substrate and at the first via hole; and
removing the carrier wafer from the polished semiconductor substrate;
wherein the forming of the semiconductor chip includes forming a semiconductor device at one side above the semiconductor substrate;

forming a ground pad at the other side above the semiconductor substrate;

forming an air-bridge metal connecting the semiconductor device and the ground pad;

forming an insulating layer on the front side of the semiconductor substrate including the air-bridge metal;

forming a second via hole where the air-bridge metal is exposed at the insulating layer; and forming a second metal layer above the exposed air-bridge metal and the insulating layer.

8. The manufacturing method of a semiconductor apparatus of claim 7, wherein the forming of the semiconductor chip further includes:

adhering a support substrate onto the second metal layer;

forming a third via hole where the second metal layer is exposed at the support substrate; and forming an electrode pad at the third via hole.

9. The manufacturing method of a semiconductor apparatus of claim 7, wherein in the forming of the ground pad, the ground pad is formed by laminating nickel (Ni) and gold (Au) in sequence.

10. The manufacturing method of a semiconductor apparatus of claim 7, wherein in the forming of the first via hole, the first via hole is formed through any one dry etching method of ion beam milling, reactive ion etching (RIE) and inductively coupled plasma (ICP) etching using any one reaction gas of $BCl_3$, $Cl_2$, $CH_4$, $CHF_3$, $CCl_4$ and $SF_6$.

11. The manufacturing method of a semiconductor apparatus of claim 7, wherein the forming of the first metal layer includes:

forming a seed metal layer by laminating titanium (Ti) and gold (Au) in sequence; and plating the seed metal layer with gold (Au).

12. The manufacturing method of a semiconductor apparatus of claim 11, wherein in the plating of the seed metal layer with gold (Au), the thickness of the plated gold is 5 μm to 10 μm.

* * * * *